United States Patent [19]

Ueno et al.

[11] 4,143,212
[45] Mar. 6, 1979

[54] SEALED STORAGE BATTERY

[75] Inventors: Mitsushi Ueno, Yokohama; Tamotsu Shirogami, Yamato, both of Japan

[73] Assignee: Tokyo Shibaura Electric Co., Ltd., Kawasaki, Japan

[21] Appl. No.: 842,889

[22] Filed: Oct. 17, 1977

[30] Foreign Application Priority Data

Oct. 18, 1976 [JP] Japan .................................. 51-123859
Oct. 18, 1976 [JP] Japan .................................. 51-123860

[51] Int. Cl.² ...................... H01M 10/34; H01M 10/48
[52] U.S. Cl. ............................................ 429/7; 429/59; 429/91; 429/94; 320/48
[58] Field of Search ........................................ 429/57–59, 429/91, 92, 94, 7, 223, 229, 231; 320/46, 48

[56] References Cited

U.S. PATENT DOCUMENTS

| 2,104,973 | 1/1938 | Dassler ........................ 429/59 |
| 3,080,440 | 3/1963 | Ruetschi et al. ............... 429/59 |
| 3,096,215 | 7/1963 | Voss et al. .................... 429/59 |
| 3,462,303 | 8/1969 | Reber ........................... 429/58 |
| 3,907,588 | 9/1975 | Bergum .......................... 429/7 |

Primary Examiner—Anthony Skapars
Attorney, Agent, or Firm—Finnegan, Henderson, Farabow & Garrett

[57] ABSTRACT

A sealed storage battery comprising a sealed container, an electricity generating means contained in the sealed container and composed of a positive electrode, a negative electrode and an electrolyte, a hydrogen gas oxidation auxiliary electrode disposed within the sealed container, and a resistance means connected to the auxiliary electrode and having an inverse current checking characteristic (or property).

In this sealed storage battery, the (critical) point of time of overcharging in charging the sealed storage battery may be detected by monitoring the variation of the voltage between the positive electrode or a separately provided measurement electrode and the auxiliary electrode.

38 Claims, 14 Drawing Figures

SEALED STORAGE BATTERY

BACKGROUND OF THE INVENTION

This invention relates to sealed batteries and a method for detecting overcharging thereof, more specifically to sealed batteries with a hydrogen gas oxidation auxiliary electrode capable of detecting overcharging for prevention thereof.

Heretofore, in charging sealed batteries such as nickel-zinc batteries, nickel-cadmium batteries and lead-acid batteries, plenty of hydrogen and oxygen gases have been produced at the negative and positive electrodes respectively in case of overcharging, thereby causing various problems including an increase of the battery pressure which would lead to expansion of the container or leakage of the electrolyte. While these problems may be solved by detecting overcharging and stopping charging, there have conventionally been proposed the following methods of overcharging detection.

(1) A method in which the battery terminal voltage is measured.
(2) A method in which the quantity of electricity with which the battery is charged is measured by using a coulometer.
(3) A method in which the temperature of the battery or a catalyst therein is measured.
(4) A method in which the specific gravity of the electrolyte is measured.

However, these methods were not satisfactory for practical use because of their substantial errors in overcharging detection. In method (1) wherein the battery terminal voltage is measured to detect the terminal voltage rise at time of overcharging, thereby detecting the overcharging, for example, the terminal voltage was substantially affected by the changes of the internal resistance of the battery and the ambient temperature, so that it was difficult to secure high-accuracy detection of overcharging.

Further, in an alternative prior art method, overcharging is detected by measuring the current flowing between the negative electrode and an oxygen gas oxidation auxiliary electrode disposed within the battery. In this method production of the oxygen gas at overcharging may be detected by measuring the oxygen gas absorbing current flowing between the auxiliary electrode and the negative electrode. This method, however, is subject to a shortcoming that the auxiliary electrode may easily be oxidized and deteriorated by the oxygen gas, thereby reducing the sensitivity as well as the overcharging detecting accuracy.

SUMMARY OF THE INVENTION

An object of this invention is to provide sealed storage batteries capable of being used in safety without overcharging.

Another object of the invention is to provide a method for detecting overcharging of the sealed storage batteries with high accuracy.

Still another object of the invention is to provide sealed storage battery systems combined with a charging device capable of controlling finish of charging by detecting overcharging.

According to an embodiment of the invention, there is provided a sealed storage battery comprising (a) a sealed container, (b) an electricity generating means contained in the sealed container and composed of a positive electrode, a negative electrode and an electrolyte, (c) a hydrogen gas oxidation auxiliary electrode disposed within the sealed container, and (d) a resistance means connected between the positive electrode and the auxiliary electrode and having an inverse current checking characteristic.

According to another embodiment of the invention, there is provided a sealed storage battery comprising (a) a sealed container, (b) an electricity generating means contained in the sealed container and composed of a positive electrode, a negative electrode and an electrolyte, (c) a hydrogen gas oxidation auxiliary electrode disposed within the sealed container, (d) a measurement electrode disposed within the sealed container, and (e) a resistance means connected between the measurement electrode and the auxiliary electrode and having an inverse current checking characteristic.

According to still another embodiment of the invention, there is provided a method for detecting overcharging of a sealed storage battery comprising a positive electrode, a negative electrode, an electrolyte, and a sealed container for containing thereof, consisting of: disposing a waterproof hydrogen oxidation auxiliary electrode within the container; connecting the positive electrode with the auxiliary electrode through a resistance means with an inverse current checking characteristic; and measuring variations of the voltage between the positive electrode and the auxiliary electrode.

According to an alternative embodiment of the invention, there is provided a method for detecting overcharging of a sealed storage battery comprising a positive electrode, a negative electrode, an electrolyte, and a sealed container for containing thereof, consisting of: disposing a waterproof hydrogen oxidation auxiliary electrode and a measurement electrode within the container, connecting the measurement electrode with the auxiliary electrode through a resistance means with an inverse current checking characteristic, and measuring variations of the voltage between the measurement electrode and the auxiliary electrode.

According to a further alternative embodiment of the invention, there is provided a sealed storage battery system comprising the aforementioned sealed storage battery and a charging device with a means for stopping charging by detecting overcharging.

DETAILED DESCRIPTION OF THE PREFERRED EMBODIMENTS

Now I will describe this invention more definitely with reference to the accompanying drawings.

The sealed storage battery of the invention is subject to two embodiments (types); one with the positive electrode used as a measurement electrode and the other with a measurement electrode provided separately from the positive electrode. There will first be described the embodiment using the positive electrode as the measurement electrode. The measurement electrode as referred to hereinafter means the separately provided electrode alone.

Figure 1:
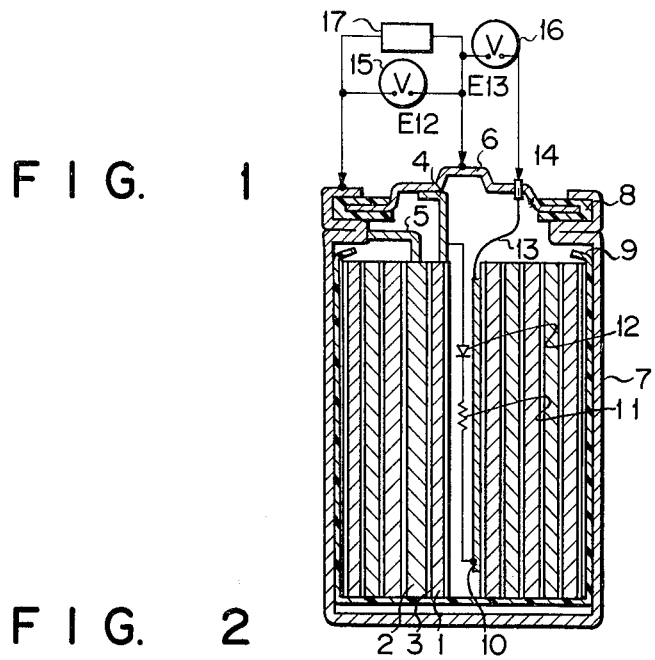
FIG. 1 is a sectional view of the sealed storage battery according to an embodiment of this invention.

The battery shown in FIG. 1 is a sealed nickel-zinc storage battery. This battery is composed of an electricity generating means and an overcharging detecting means. The electricity generating means comprises a sintered-type positive electrode layer 1 mainly composed of a nickel compound and a negative electrode layer 2 mainly composed of a zinc compound, these layers being laminated and rolled with a separator 3 serving also as an electrolyte holding layer interposed between, and an electrolyte (not shown). The electricity generating means is contained in a metal container 7 with one opening end which serves also as a negative electrode terminal. The generating means and the container 7 are electrically insulated from each other by means of a heat-shrinkable tube 9 with an electrical insulating property. The container 7 is sealed with a metal cover 6 serving also as a positive electrode terminal through an electrical insulator 8. The positive electrode layer 1 is connected with the cover 6 by a lead 4, while the negative electrode layer 2 is connected with the container 7 by a lead 5.

Meanwhile, the overcharging detecting means comprises a hydrogen gas oxidation auxiliary electrode 10 disposed at the hollow core portion of the rolled generating means, a fixed resistance 11 and a silicon diode 12 to form a resistance means with an inverse current checking characteristic, and an auxiliary electrode terminal 14. The resistance 11 and the silicon diode 12 are connected in series between the positive electrode and the auxiliary electrode. The resistance 11 may be omitted to leave the silicon diode 12 alone. Alternatively, the resistance 11 and silicon diode 12 may be disposed outside the container 7. Further, an auxiliary lead 13 is provided for connecting the auxiliary electrode 10 with the auxiliary electrode terminal 14.

Now I will describe the operation of the aforementioned sealed nickel-zinc storage battery at time of charging and overcharging.

Hydrogen gas, which has been produced at the negative electrode 2 at charging, discharging and self-discharging, is oxidized at the auxiliary electrode 10 according to an electrode reaction given as follows:

$$H_2 + 2OH^- \rightarrow 2H_2O + 2e^-.$$

Accordingly, the auxiliary electrode 10 has less noble potential as compared with that of the positive electrode 1, and a hydrogen oxidation current flows from the positive electrode 1 to the auxiliary electrode 10. At overcharging, however, when an oxygen gas is produced at the positive electrode 1, the aforesaid hydrogen oxidizing reaction is interrupted, so that the auxiliary electrode 10 potential approaches the positive electrode 1 potential, reducing drastically the potential difference between the positive electrode 1 and the auxiliary electrode 10. When charging is interrupted, the oxygen gas is mostly absorbed by the negative electrode to recover the auxiliary electrode potential quickly.

It is clear from the above phenomena that production of the oxygen gas, i.e., overcharging may be detected by measuring the variation of voltage between the positive electrode 1 and the auxiliary electrode 10 with a voltmeter 16. In the storage battery of this invention, based on these phenomena, the cover 6 is provided with the auxiliary electrode terminal 14 coupled with the auxiliary electrode 10 in order to facilitate the measurement of the voltage between the positive electrode 1 and the auxiliary electrode 10.

In the above-described storage battery the auxiliary electrode 10 is waterproofed for the purpose of diffusing $H_2O$ produced by oxidation of the hydrogen. Further, the resistance 11 connected between the positive electrode 1 and the auxiliary electrode 10 is provided for checking undue advance of the hydrogen oxidizing reaction due to a large flow of current, while the diode 12 is provided for preventing the current from flowing inversely due to increased potential at the auxiliary electrode 10. Moreover, the auxiliary electrode in the battery of the invention is always refreshed by the hydrogen oxidizing reaction, so that it will never be deteriorated by oxygen, unlike the prior art auxiliary electrodes.

Comparing with the prior art methods, there will now be described an example of the storage battery of the invention with the positive electrode used as a measurement electrode and the method for detecting overcharging thereof.

EXAMPLE 1

A sealed nickel-zinc storage battery as shown in FIG. 1 was prepared. In this battery, being of C-size, the charging capacities of the positive electrode 1 and the negative electrode 2 were 1.5 Ah and 4.5 Ah respectively. For the hydrogen gas oxidation auxiliary electrode 10, there was used a porous nickel-sintered mass of 5 cm$^2$ apparent surface area and 0.3 mm thickness impregnated with a hydrogen gas absorbing catalyst composed of a mixture of platinum and tungsten carbide. Alternatively, the hydrogen gas absorbing catalyst may be composed of platinum alone. The surface of the auxiliary electrode 10 is coated with polytetrafluoroethylene, i.e., waterproofed. Further, the resistor 11 has a resistance level of 100 ohm and the diode 12 is a silicon diode, both covered with electrolyte resisting resin. As the electrolyte was used an 8N-KOH aqueous solution saturated with zinc oxide. In such battery, as shown in FIG. 1, there are provided recording voltmeters 15 and 16 for measuring the voltage between the positive electrode 1 and the negative electrode 2 and that between the positive electrode 1 and the auxiliary electrode 10 respectively. In FIG. 1 numeral 17 denotes a power source for charging the battery.

Figure 2:
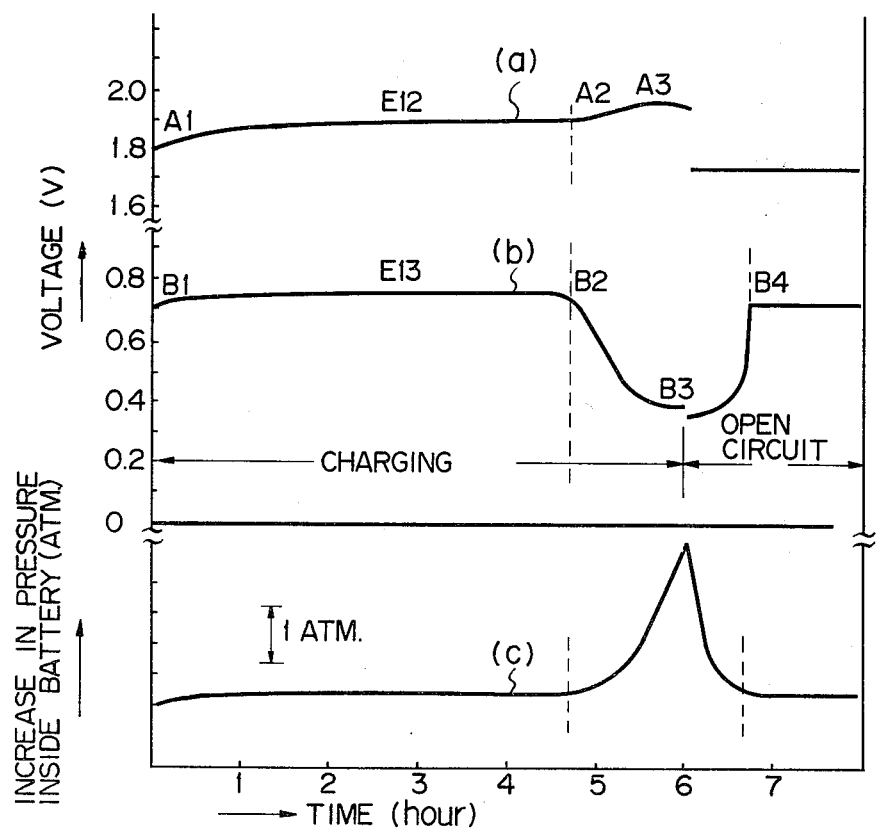
FIG. 2 is a graph showing the variations of $E_{12}$, $E_{13}$ and the pressure inside the battery with the charging time.

The above sealed nickel-zinc storage battery was charged at 300 mA for 6 hours. Curves a, b and c in FIG. 2 show the variation of the terminal voltage between the positive electrode and the negative electrode (hereinafter referred to as $E_{12}$), the variation of the terminal voltage between the positive electrode and the auxiliary electrode (hereinafter referred to as $E_{13}$), and the variation of the pressure inside the battery during the charging time, respectively. In curve $a$, the active material of the battery is shown to be charged between points $A_1$ and $A_2$, while a small increase in voltage between points $A_2$ and $A_3$ shows overcharging. Finally, at point $A_3$, most of the charging current is used for production of oxygen gas, when the production of oxygen gas increases drastically. It is clear from the fact that the pressure inside the battery increases rapidly as shown in curve $c$. Meanwhile, in curve $b$ showing the variation of $E_{13}$, there is seen a sudden voltage drop from point $B_2$, corresponding to point $A_2$ of curve $a$, onward. This is attributable to interruption of the hydrogen gas oxidation concurrent with the production of oxygen gas which causes the auxiliary electrode potential to shift to the noble direction. When charging is interrupted at point $B_3$, the oxygen gas is mostly absorbed at the negative electrode, and $E_{13}$ is recovered rapidly, resuming its normal state at point $B_4$.

Figure 3:
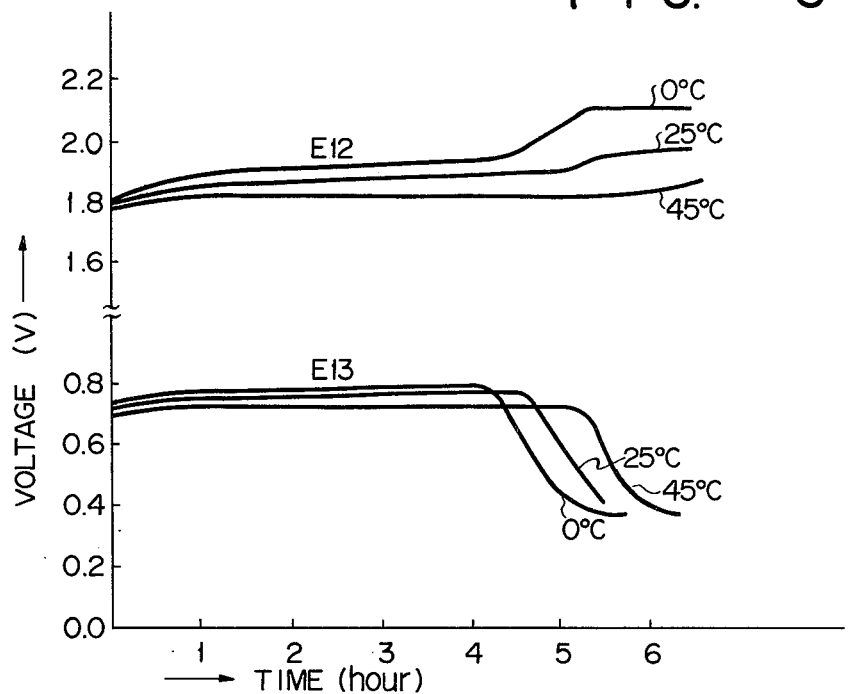
FIG. 3 is a graph showing the effect of the ambient temperature on the variations of $E_{12}$ and $E_{13}$.

FIG. 3 shows the variations of $E_{12}$ and $E_{13}$ according to the charging time with varied ambient temperatures of the battery. As may be clear from FIG. 3, the variation of $E_{12}$ when overcharging is substantially affected by the ambient temperature; the higher the ambient temperature the smaller the variation (rise) of $E_{12}$ when overcharging is, making it difficult to detect overcharging by measuring $E_{12}$. On the other hand, $E_{13}$, when overcharging, is never affected by the ambient temperature but is always subject to rapid variation (drop), allowing accurate detection of overcharging by measuring $E_{13}$.

Figure 4:
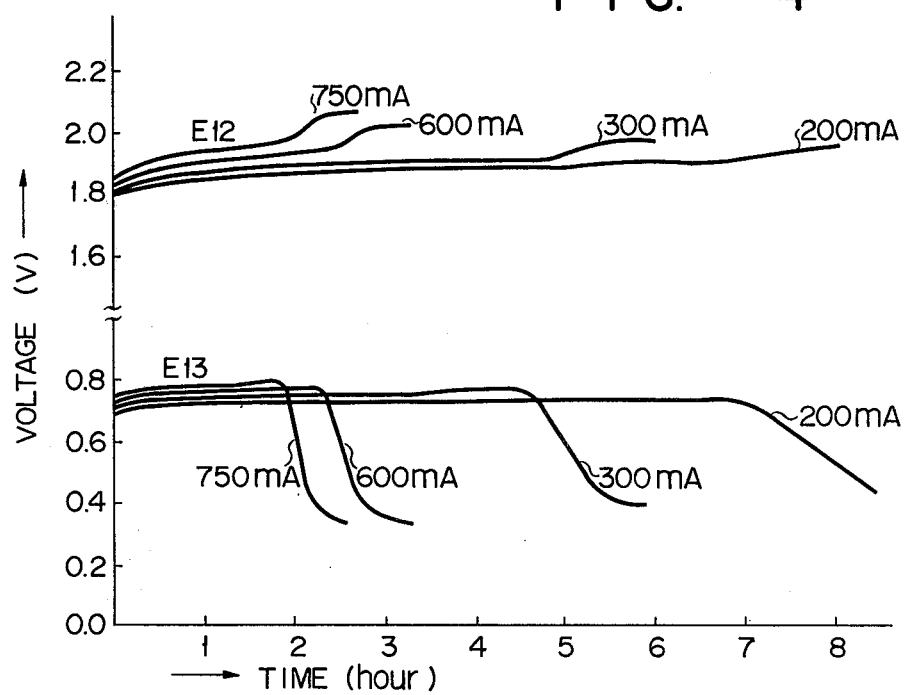
FIG. 4 is a graph showing the effect of the current on the variations of $E_{12}$ and $E_{13}$.
Figure 5:
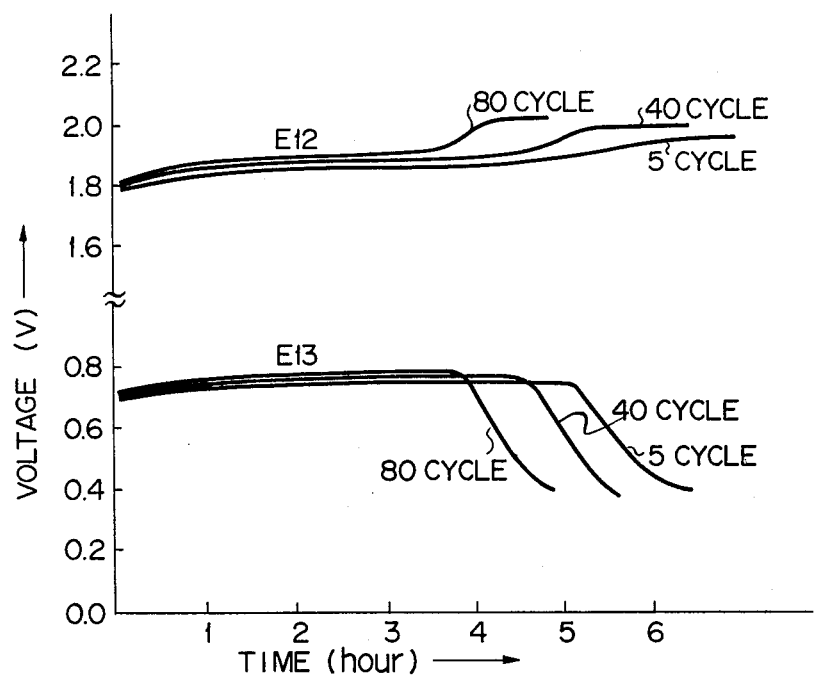
FIG. 5 is a graph showing the effect of the charge-discharge cycle number on the variations of $E_{12}$ and $E_{13}$.

Further, FIG. 4 shows the variations of $E_{12}$ and $E_{13}$ according to the charging time with varied charging currents of the battery, while FIG. 5 shows the variations of $E_{12}$ and $E_{13}$ according to the charging time with varied charge-discharge cycle numbers, that is, when charging is conducted after repeating charging-discharging varied numbers of times. As may be seen from FIGS. 4 and 5, $E_{12}$ is substantially affected by the charging current and the charge-discharge cycle number, thereby making it difficult to detect overcharging by measuring $E_{12}$. This is so because the battery capacity decreases to increase the internal resistance as the charging current or charge-discharge cycle number increases. On the other hand, $E_{13}$ is never affected by the variation of the charging current or charge-discharge cycle number, always showing a sudden variation (drop) when getting into overcharging, so that overcharging may securely be detected by measuring $E_{13}$.

As described above, the variation of $E_{12}$ may substantially be affected by the ambient temperature, charging current, and charge-discharge cycle number, thus making it difficult to detect overcharging by measuring $E_{12}$, though the variation of $E_{13}$ may not. Therefore, overcharging of the battery may be detected very easily and accurately by the overcharging detecting method of the invention consisting of measuring $E_{13}$. Thus, the sealed storage battery of the invention, which allows such easy and accurate overcharging detection, may be deemed surpassing.

Figure 6:
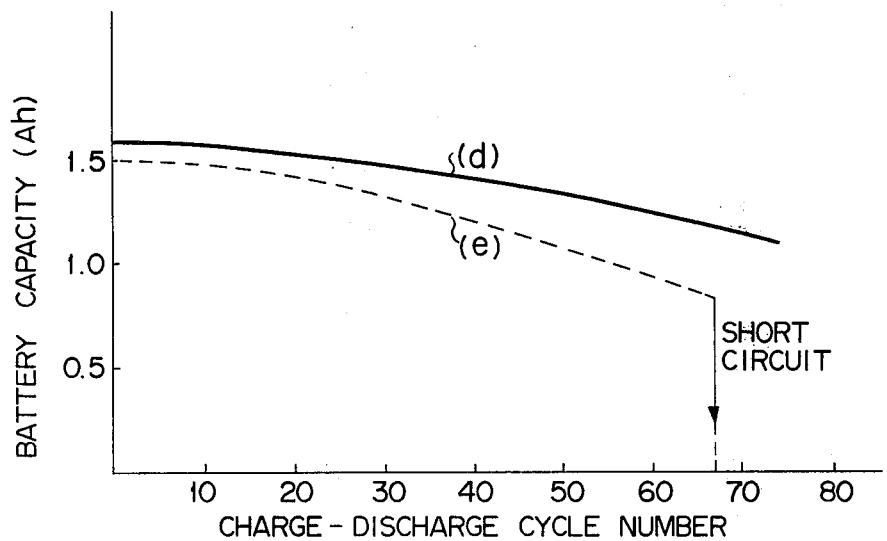
FIG. 6 is a graph showing the deterioration of the battery capacity depending on the charging system.

Meanwhile, curve $d$ in FIG. 6 shows the battery capacity according to the charge-discharge cycle number when charging-discharging is repeated with the sealed battery of the invention so that charging is finished with $E_{13}$ falling below 0.6V to avoid overcharging. As for curve $e$ in FIG. 6, it shows the battery capacity according to the charge-discharge cycle number when constant-current constant-time charging-discharging is repeated at intervals of 2 hours with each cycle (charging at 300 mA for 5 hours, discharging at 600 mA, and discharge stop at 1V). From comparison between curves $d$ and $e$ of FIG. 6 it is clear that the deterioration of the battery capacity is less significant and the cycle life is improved when charging-discharging is conducted while checking overcharging by using the sealed storage battery of the invention as compared with the case in which constant-current constant-time charging-discharging is conducted by using a conventional sealed storage battery.

While an embodiment of the sealed storage battery with the positive electrode used as a measurement electrode has been described above, there will now be described another embodiment of the sealed storage battery further provided with a measurement electrode (oxidizing agent electrode) independent of the positive electrode. This measurement electrode (oxidizing agent electrode) may have the same composition as that of the active material of the positive electrode.

Figure 7:
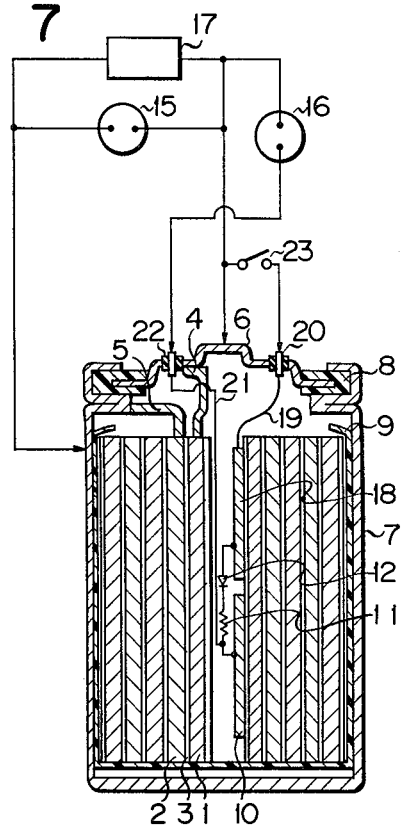
FIG. 7 is a sectional view of the sealed storage battery according to an alternative embodiment of the invention.

The sealed storage battery as shown in FIG. 7 is one similar to the sealed storage battery of FIG. 1 in which there is newly provided an oxidizing agent electrode 18 with the same composition as that of the positive electrode and a resistance means with an inverse current checking characteristic, including such as the fixed resistance 11 and the silicon diode 12, is connected between the oxidizing agent electrode 18 and the auxiliary electrode 10. Further, the cover 6 is provided with a measurement electrode terminal 20 and an auxiliary electrode terminal 22, which are coupled to the oxidizing agent 18 and the auxiliary electrode 10 through a measurement lead 19 and an auxiliary lead 21, respectively.

In thus constructed sealed storage battery, hydrogen gas produced at the negative electrode 2 is oxidized and absorbed at the auxiliary electrode 10 by an electrochemical reaction which is caused between the hydrogen gas oxidation auxiliary electrode 10 and the oxidizing agent electrode.

As shown in FIG. 7, a switch 23 is provided between the measurement electrode terminal 20 and the cover 6 serving also as a positive electrode terminal. The positive electrode terminal 6 and the oxidizing agent electrode terminal 20 are electrically connected with each other during charging of the battery, while they are disconnected during discharging or when the circuit is opened. The reason for this is given as follows.

That is, during discharging, the capacity of the oxidizing agent electrode 18 may be retained by electrically disconnecting the positive electrode terminal 6 and the oxidizing agent electrode terminal 20 (or positive electrode 1 and oxidizing agent electrode 18) from each other even when the battery capacity of the positive electrode 1 is exhausted, thus preventing the hydrogen gas absorption from being interrupted.

Moreover, if hydrogen gas is produced at the positive electrode 1 due to over-discharging or pole changing, capacity loss of the oxidizing electrode 18 and electrode potential drop will be checked, so that the hydrogen gas will be absorbed continuously. Meanwhile, in the battery without the oxidizing agent electrode 18, when the capacity of the positive electrode was exhausted, the hydrogen gas produced by over-discharging or pole changing could not be absorbed with the positive electrode 1 connected with the auxiliary electrode 10 through a resistance means having an inverse current checking characteristic. In charging, by electrically connecting the positive electrode terminal 6 with the oxidizing agent electrode terminal 20, the oxidizing agent auxiliary electrode 18, as well as the positive electrode 1, may be charged to recover the capacity loss of the oxidizing agent electrode 18 due to the hydrogen gas absorption and self-discharging, allowing a hydrogen gas to be absorbed afresh.

Thus, hydrogen gas absorption may be effected whether the positive electrode 1 is connected with the oxidizing agent electrode 18 or not so long as the oxidizing agent electrode 18 holds any capacity. If a nickel compound is used for the positive electrode 1, for example, reactions will take place as follows.

Reaction at the oxidizing agent electrode:

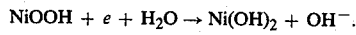

$NiOOH + e + H_2O \rightarrow Ni(OH)_2 + OH^-$.

Reaction at the auxiliary electrode 10:

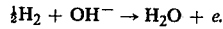

$\frac{1}{2}H_2 + OH^- \rightarrow H_2O + e$.

Further, by interposing the silicon diode 12 and the 10 ohm to 2,000 ohm fixed resistance 11, as a resistance means with an inverse-current checking characteristic between the oxidizing agent electrode 18 and the auxiliary electrode 10, the potential at the auxiliary electrode 10 may be held in a potential range less noble than that at the oxidizing agent electrode 18 by approximately 0.7V or more, thereby efficiently ionizing the hydrogen gas. Accordingly, the potential at the auxiliary electrode 10 is prevented from shifting to the oxygen gas producing potential level to check deterioration of the performance of the auxiliary electrode 10.

Moreover, by measuring the voltage between the oxidizing agent electrode terminal 20 and the hydrogen gas oxidation auxiliary electrode terminal 22 at charging and overcharging, production of an oxygen gas at the end of the charging may be confirmed, thus making possible detection at the end of the charging.

That is, the hydrogen gas oxidation auxiliary electrode 10 at charging is polarized in the base direction as compared with the oxidizing agent electrode potential, and the hydrogen gas produced by charging-discharging and self-discharging is electrochemically oxidized to cause a hydrogen absorbing current ($H_2 + 2OH^- \rightarrow 2H_2O + 2e^-$) to flow. When overcharging, however, the hydrogen absorbing current is reduced rapidly in concurrence with production of oxygen gas, and the hydrogen gas oxidation auxiliary electrode 10 potential approaches drastically the oxidizing agent electrode 18 potential, suddenly reducing the voltage between the oxidizing agent electrode 1 and the hydrogen gas oxidation auxiliary electrode 10. When charging is interrupted, the oxygen gas is absorbed by the negative electrode 2 to recover rapidly the potential at the hydrogen gas oxidation auxiliary electrode 10.

Accordingly, by measuring the voltage between the oxidizing agent electrode 18 and the hydrogen gas oxidation auxiliary electrode 10, there may be detected a sudden voltage drop due to the production of oxygen gas when overcharging, thus making possible detection of the end of the charging.

In this invention, the resistance value of the fixed resistance was set at 10 ohm to 2,000 ohm for the following reasons.

First, if the resistance value is below 10 ohm, the reduction in voltage between the oxidizing agent electrode and the auxiliary electrode (hereinafter referred to as $E_{13}$) will be small even when overcharging, and it will be very difficult to detect overcharging because of a lower reduction speed. On the other hand, if the resistance level exceeds 2,000 ohm, then the reduction speed of $E_{13}$ will become higher to facilitate overcharging detection, though the speed of absorbing the hydrogen gas produced by charging-discharging or overcharging will substantially be reduced. Namely, if 2,000 ohm is exceeded, only a small portion of hydrogen gas will be allowed to flow to the auxiliary electrode, thereby reducing the hydrogen gas absorbing speed and gradually increasing the pressure inside the battery. Therefore, the resistance value of the fixed resistance should preferably range from 10 ohm to 2,000 ohm. In C-, D- and AA-size batteries used as small-sized general batteries, it is further desirable to set the resistance value within a range of 100 ohm to 500 ohm from a point of view of the hydrogen gas absorption and detecting oxygen gas production. The same range of the resistance value of the fixed resistance applies to the aforesaid battery without the oxidizing agent electrode or with the positive electrode used as the measurement electrode.

Now there will be described another example of the storage battery of the invention with a measurement electrode provided separately from the positive electrode and the method for detecting overcharging thereof.

EXAMPLE 2

A sealed nickel-zinc storage battery as shown in FIG. 7 was prepared. For the oxidizing agent electrode 18, there was used a sintered-type nickel electrode of 0.7 mm thickness and 4 cm$^2$ (2cm×2cm) apparent surface area which shares the composition with the nickel electrode. As for other constructions, they were substantially the same as those of the battery of Example 1. Now I will describe the performance of this battery.

Figure 8:
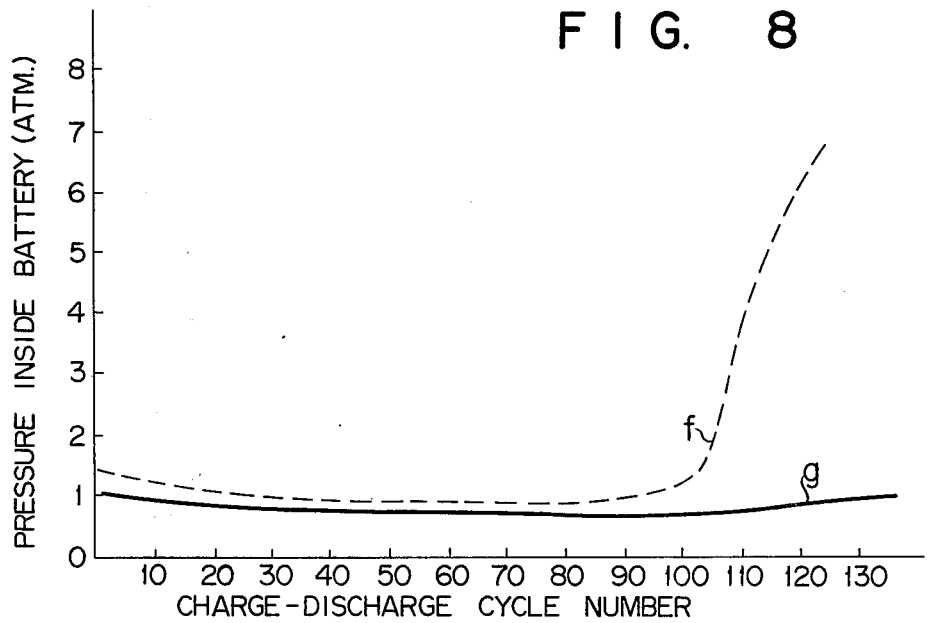
FIGS. 8 and 9 are graphs showing the characteristics of the sealed storage battery of the invention.

FIG. 8 shows the measurement results of charging-discharging repeated at intervals of 2 hours (charging current at 300 mA for 5 hours (1.5 Ah), discharge current at 600 mA, and discharge stop at 1V), indicating the pressure inside the battery (open circuit) accompanying the charge-discharge cycle by means of a full line (g). The oxidizing agent electrode terminal 20 and the positive electrode terminal 6 were electrically connected with each other during charging, while they were disconnected during discharging or when the circuit was opened. In this example a 100 ohm resistor was used for the fixed resistance. Further, in order to clarify the effect of the invention, there is indicated by a broken line (f) the pressure inside the battery when charging-discharging was repeated under the same conditions with the oxidizing agent electrode terminal 20 and the positive electrode terminal 6 kept electrically unconnected.

As may be clear from FIG. 8, the effect of absorbing the hydrogen gas inside the battery of the invention is more noticeable when charging-discharging is repeated a number of times (on and after 100th cycle in this example) as compared with the case in which charging-discharging is conducted with the oxidizing agent electrode terminal 20 and the positive electrode terminal 6 kept electrically unconnected.

That is, in this invention, the oxidizing agent electrode is charged with each cycle of charging to recover the capacity of the oxidizing agent electrode, so that the hydrogen gas absorption may be conducted efficiently.

On the other hand, if charging-discharging is repeated with the oxidizing agent electrode terminal 20 and the positive electrode 6 kept electrically unconnected, the oxidizing agent electrode capacity will be gradually reduced by the hydrogen gas absorption and self-discharging. When the capacity is lost, the hydrogen gas absorption is stopped and the hydrogen gas accumulates gradually in the battery. In this example, there is expressly shown the prohibition of the hydrogen absorbing capability accompanying the capacity loss of the oxidizing agent electrode on and after 100th cycle.

Figure 9:
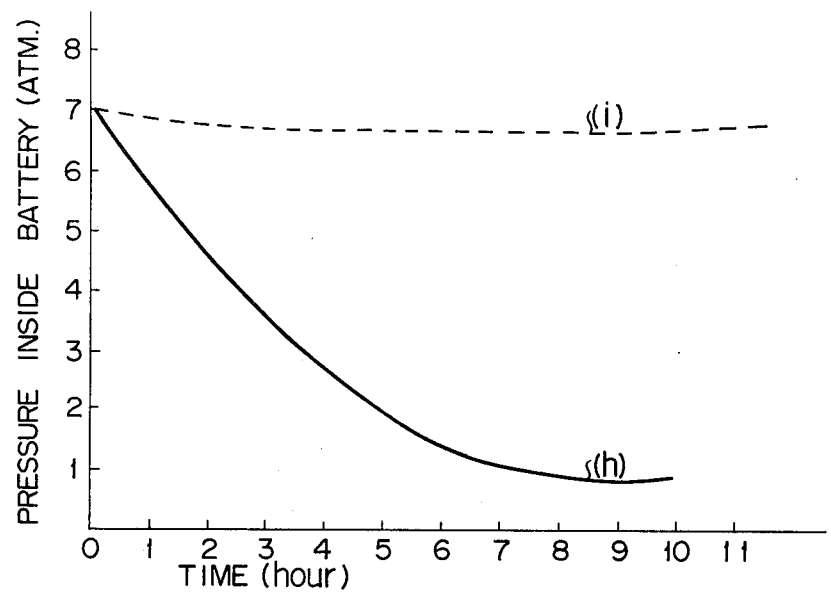

Meanwhile, FIG. 9 shows the measurement results of the pressure inside the battery with circuit opened when a 7 atm. hydrogen gas has accumulated in the battery with over-discharging or pole changing.

A full line (h) indicates a case in which the sealed zinc alkaline secondary battery according to the invention was normally used, while a broken line (i) shows the result of a case in which the oxidizing agent electrode terminal 20 was kept electrically connected with the positive electrode terminal 6 during the charge-discharge cycle.

When the oxidizing agent electrode is electrically independent of the positive electrode, it will be subject to neither over-discharging nor pole changing if the positive electrode is overcharged or reversed. That is, the oxidizing agent electrode capacity is retained, so that the produced hydrogen gas may be continuously absorbed. On the other hand, if over-discharging or pole changing is conducted with the oxidizing agent electrode terminal 20 kept electrically connected with the positive electrode 6, the oxidizing agent electrode, as well as the positive electrode, will be subject to over-discharging or pole changing, so that the oxidizing agent electrode capacity will be lost in case of positive electrode capacity loss to reduce its electrode potential. Therefore, the hydrogen gas will be prevented from being absorbed efficiently.

Thus, in this invention, the oxidizing agent electrode may be charged by electrically connecting the oxidizing agent electrode terminal 20 with the positive electrode terminal 6, so that there will be caused no prohibition of hydrogen gas absorption accompanying the capacity loss of the oxidizing agent electrode. Further, since over-discharging or pole changing will not be caused at the oxidizing agent electrode by electrically disconnecting the oxidizing agent electrode terminal 20 from the positive electrode terminal 6 in case of discharging or open circuit, the produced hydrogen gas will be continuously absorbed.

As described above, this invention, provided with the hydrogen oxidation auxiliary electrode and oxidizing agent electrode for absorbing hydrogen gas and so designed as to connect electrically the auxiliary electrode with the oxidizing agent electrode through the resistance means with an inverse current checking characteristic, connect (shortcircuit) electrically the positive electrode and the oxidizing agent electrode only when charging and disconnect them in case of discharging and open circuit, may generally be applicable to storage batteries producing hydrogen gas during charging-discharging and self-discharging. Although in the aforementioned examples the switch 23 is used for connecting and/or disconnecting the oxidizing agent electrode and the positive electrode when charging and/or discharging, it is to be understood that any other suitable means may be used in place thereof, provided it can produce the intended effect.

Although, in the battery of the invention as described above, the resistor with an inverse current checking characteristic provided for the auxiliary electrode is disposed inside the battery, it may be disposed either outside the battery or inside the detecting or charging device.

In other types of storage batteries, as well as in the zinc-nickel battery, the composition of the oxidizing agent electrode should preferably be the same as that of the positive electrode. In lead-acid and silver oxide-zinc storage batteries, for example, oxidizing agent electrodes composed of lead dioxide and silver oxide may be used respectively. By making the composition of the oxidizing agent electrode identical with that of the positive electrode, production of gas from these two electrodes may be checked efficiently and both electrodes may be kept in the same charging conditions.

Thus, the sealed storage battery of the invention allows easy detection of the end of charging, so that there may be composed a highly secure sealed storage battery system by combining such battery with a charging device capable of interrupting the charging current when the voltage $E_{13}$ is lowered below a prescribed level.

Figure 10:
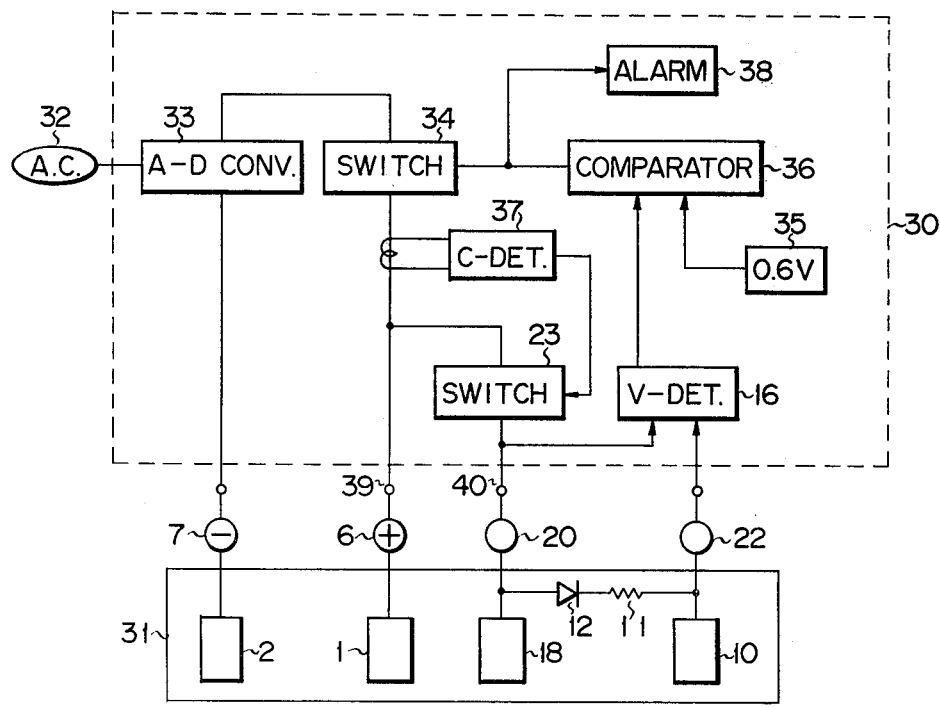
FIGS. 10 and 11 are circuit diagrams of the charging device applicable to the sealed storage battery of the invention.

This charging device may be composed of such general electric circuits as shown in FIG. 10, for example. That is, a charging device 30 as shown in FIG. 10 is composed of a power circuit for converting a current from an AC power source 32 into a DC current with which a battery 31 is to be charged and supplying such current to the positive electrode and the negative electrode, and a detecting circuit for detecting the voltage between the auxiliary electrode 10 and the oxidizing agent electrode 18 and operating a switch 34 when such voltage is lowered below the set point.

The detecting circuit operates as follows: comparing the value of $E_{13}$ (voltage between the auxiliary electrode 10 and the oxidizing agent electrode 18) when overcharging is being reached or the voltage of a reference power source 35 set at e.g. 0.6V with the voltage detected by the voltage detector (or voltmeter) 16 by means of a comparator 36, an output signal is produced by the comparator 36 when the detecting voltage is lowered below 0.6V and the switch 34 is opened by the output signal. This switch 34 may be replaced by a relay contact circuit or a semiconductor switch circuit. In the battery provided with the oxidizing agent electrode 18 as shown in FIG. 10, the oxidizing agent electrode 18 and the positive electrode 10 are required to be at the same potential during charging, so that the switch 34 is closed. However, when the switch 34 is opened, a galvanometer 37 detects interruption of the current flow through the positive electrode and produces an output signal to open the switch 23. While the device as shown in FIG. 10 is further provided with an alarm 38, completion of charging may be definitely indicated by operating the alarm 38 with the output signal from the comparator 36.

Figure 11:
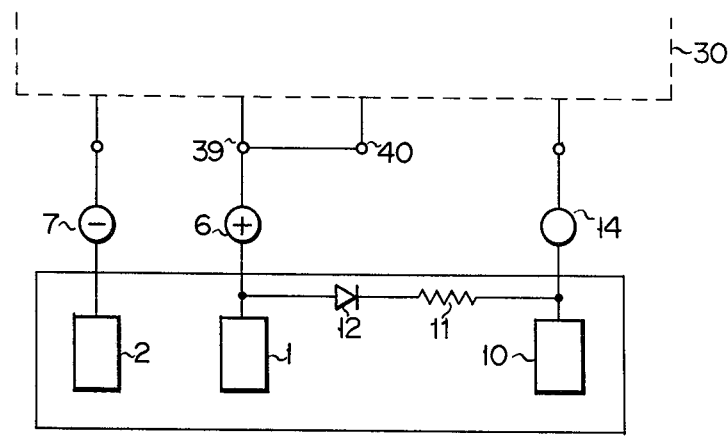

Further, FIG. 11 shows a system without the oxidizing agent electrode 18, in which terminals 39 and 40 of the charging device 30 are required to be closed.

Figure 12:
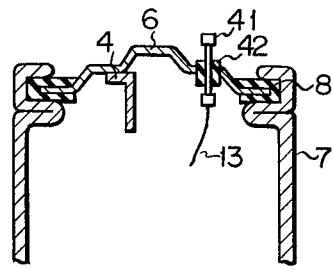
FIGS. 12 to 14 are sectional views of the top portion of the sealed storage battery of the invention illustrating the varied methods of setting the auxiliary electrode terminal.
Figure 13:
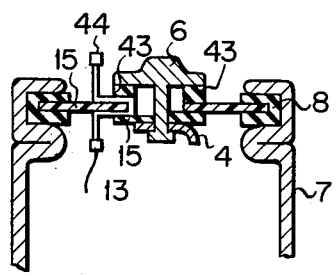
Figure 14:
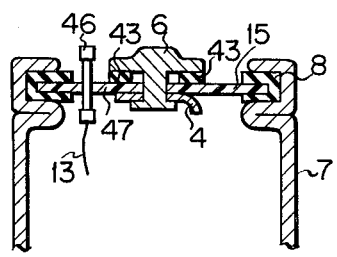

FIGS. 12 to 14 show varied configurations of the auxiliary electrode terminal or oxidizing agent electrode terminal in the battery of the invention illustrating the methods of setting thereof.

In FIG. 12 an auxiliary electrode terminal 41 is attached to the cover 6 through an insulating resin, while in FIG. 13 an Ω-shaped terminal 44 is interposed between the cover 6 and an insulating resin plate through a sealing rubber ring 43. Meanwhile, in FIG. 14 a terminal 46 extends through an insulating resin plate 47 used as a top plate.

What we claim is:

1. A sealed storage battery of the type wherein hydrogen gas is evolved upon charging and oxygen gas is evolved upon overcharging, the battery comprising:
   (a) a sealed container;
   (b) an electricity generating means contained in said sealed container and composed of a positive electrode, a negative electrode and an electrolyte;
   (c) means for detecting the onset of an overcharging condition, said detecting means including
      (i) a hydrogen gas oxidation auxiliary electrode disposed within said sealed container, the hydrogen gas being electrochemically oxidized upon charging and said electrochemical oxidation being interrupted at said auxiliary electrode upon overcharging by the evolution of oxygen gas;
      (ii) a resistance means connected between said positive electrode and said auxiliary electrode and having and inverse current checking characteristic; and
      (iii) a terminal disposed outside the battery for providing sensing contact with said auxiliary electrode, said terminal including an electrical lead connected to said auxiliary electrode.

2. A sealed storage battery according to claim 1, wherein said resistance means is waterproofed and contained in said sealed container.

3. A sealed storage battery according to claim 1, wherein said electricity generating means includes a sheet-like positive electrode and a sheet-like negative electrode rolled up with a sheet-like separator interposed between.

4. A sealed storage battery according to claim 3, wherein said resistance means is disposed in a space at the roll center of said electricity generating means.

5. A sealed storage battery according to claim 1, wherein said resistance means is a silicon diode.

6. A sealed storage battery according to claim 1, wherein said resistance means includes a silicon diode and a fixed resistance.

7. A sealed storage battery according to claim 6, wherein the resistance value of said fixed resistance ranges from 10 ohm to 2,000 ohm.

8. A sealed storage battery according to claim 1, wherein said auxiliary electrode is composed of a porous nickel-sintered mass impregnated with platinum.

9. A sealed storage battery according to claim 8, wherein the surface of said sintered mass is treated with polytetrafluoroethylene.

10. A sealed storage battery according to claim 1, wherein said electricity generating means composes a Zn-Ni alkaline battery.

11. A sealed storage battery according to claim 1, wherein a terminal of said auxiliary electrode is fixed to a cover of said sealed container through an insulating material.

12. A sealed storage battery according to claim 11, wherein said cover is composed of an insulating material.

13. A sealed storage battery according to claim 12, wherein said terminal is formed in the shape of an Ω whose bent portion holds the edge portion of said cover and is in turn held by the holding portion of said cover.

14. A sealed storage battery of the type wherein hydrogen gas is evolved upon charging and oxygen gas is evolved upon overcharging, the battery comprising:
   (a) a sealed container;
   (b) an electricity generating means contained in said sealed container and composed of a positive electrode, a negative electrode and an electrolyte;
   (c) means for detecting the onset of an overcharging condition, said detecting means including
      (i) a hydrogen gas oxidation auxiliary electrode disposed within said sealed container, the hydrogen gas being electrochemically oxidized upon charging and said electrochemical oxidation being interrupted at said auxiliary electrode upon overcharging by the evolution of oxygen gas;
      (ii) an oxidizing agent measurement electrode disposed within said sealed container, said measurement electrode having a retained oxidizing capacity during substantially complete discharge of the battery;
      (iii) a resistance means connected between said measurement electrode and said auxiliary electrode and having an inverse current checking characteristic; and
      (iv) a pair of terminals disposed outside the battery for providing sensing contact with said auxiliary electrode and said measurement electrode, each of said pair including an electrical lead connected to the respective one of said measurement and auxiliary electrodes.

15. A sealed storage battery according to claim 14, wherein said measurement electrode has substantially the same composition as that of said positive electrode.

16. A sealed storage battery according to claim 14, wherein said resistance means is waterproofed and contained in said sealed container.

17. A sealed storage battery according to claim 14, wherein said electricity generating means includes a sheet-like positive electrode and a sheet-like negative electrode rolled up with a sheet-like separator interposed between.

18. A sealed storage battery according to claim 17, wherein said resistance means is disposed in a space at the roll center of said electricity generating means.

19. A sealed storage battery according to claim 14, wherein said resistance means is a silicon diode.

20. A sealed storage battery according to claim 14, wherein said resistance means includes a silicon diode and a fixed resistance connected with each other.

21. A sealed storage battery according to claim 20, wherein the resistance value of said fixed resistance ranges from 10 ohm to 2,000 ohm.

22. A sealed storage battery according to claim 14, wherein said auxiliary electrode is composed of a porous nickel-sintered mass impregnated with platinum.

23. A sealed storage battery according to claim 22, wherein the surface of said sintered mass is treated with polytetrafluoroethylene.

24. A sealed storage battery according to claim 14, wherein said electricity generating means composes a Zn-Ni alkaline battery.

25. A sealed storage battery according to claim 14, wherein a terminal of said auxiliary electrode is fixed to a cover to said sealed container through an insulating material.

26. A sealed storage battery according to claim 25, wherein said cover is composed of an insulating material.

27. A sealed storage battery according to claim 26, wherein said terminal is formed in the shape of an $\Omega$ whose bent portion holes the edge portion of said cover and is in turn held by the holding portion of said cover.

28. A method for detecting overcharging of a sealed storage battery of the type wherein hydrogen gas is evolved upon charging and oxygen gas is evolved upon overcharging, the battery including a positive electrode, a negative electrode, an electrolyte, and a sealed container for containing thereof, comprising disposing a waterproof hydrogen oxidation auxiliary electrode within said container; connecting said positive electrode with said auxiliary electrode through a resistance means with an inverse current checking characteristic; charging said sealed storage battery and measuring variations of the voltage between said positive electrode and said auxiliary electrode during said charging.

29. A method for detecting overcharging of a sealed storage battery of the type wherein hydrogen gas is evolved upon charging and oxygen gas is evolved upon overcharging, the battery including a positive electrode, a negative electrode, an electrolyte, and a sealed container for containing thereof, comprising disposing a waterproof hydrogen oxidation auxiliary electrode and a measurement electrode within said container; connecting said measurement electrode with said auxiliary electrode through a resistance means with an inverse current checking characteristic; connecting said positive electrode with said measurement electrode; charging said sealed storage battery; and measuring variations of the voltage between said measurement electrode and said auxiliary electrode.

30. A method for detecting overcharging of a sealed storage battery according to claim 29, wherein said positive electrode is connected with said measurement electrode at charging, and said positive electrode is disconnected from said measurement electrode at discharging.

31. A sealed storage battery system comprising said sealed storage battery of claim 1 and a charging device with a means for stopping charging by detecting overcharging.

32. A sealed storage battery system comprising said sealed storage battery of claim 14 and a charging device with a means for stopping charging by detecting overcharging.

33. A sealed storage battery system capable of detecting overcharging comprising a charging device and a sealed storage battery in which hydrogen gas is evolved upon charging and oxygen gas is evolved upon overcharging, the battery including
 (a) a sealed container;
 (b) an electricity generating means contained in said sealed container and composed of a positive electrode, a negative electrode and an electrolyte;
 (c) means for detecting an overcharging condition, said detecting means including
  (i) a hydrogen gas oxidation auxiliary electrode disposed within said sealed container, the hydrogen gas being electrochemically oxidized upon charging and the said electrochemical oxidation being interrupted upon overcharging by the evolution of oxygen gas;
  (ii) a resistance means connected between said positive electrode and said auxiliary electrode and having an inverse current checking characteristic; and
  (iii) a terminal disposed outside the battery for providing sensing contact with said auxiliary electrode, said terminal including an electrical lead connected to said auxiliary electrode; and said charging device including means for measuring variations in the voltage between said positive electrode and said auxiliary electrode to detect overcharging of said sealed storage battery.

34. A sealed storage battery system according to claim 33, wherein said charging device includes a means for stopping charging in response to the detection of overcharging by said means for measuring variation in voltage.

35. A sealed storage battery system capable of detecting overcharging comprising a charging device and a sealed storage battery in which hydrogen gas is evolved upon charging and oxygen gas is evolved upon overcharging, the battery including
 (a) a sealed container;
 (b) an electricity generating means contained in said sealed container and composed of a positive electrode, a negative electrode and an electrolyte;
 (c) means for detecting an overcharging condition, said detecting means including
  (i) a hydrogen gas oxidation auxiliary electrode disposed within said sealed container, the hydrogen gas being electrochemically oxidized upon charging and said electrochemical oxidation being interrupted upon overcharging due to evolution of oxygen gas;
  (ii) an oxidizing agent measurement electrode disposed within said sealed container, said measurement electrode having a retained oxidizing capacity during substantially complete discharge of the battery;
  (iii) a resistance means connected between said measurement electrode and said auxiliary electrode and having an inverse current checking characteristic; and said positive electrode being connected with said measurement electrode upon charging and disconnected upon discharging and upon circuit-opening, said charging device including measurement means for measuring variations in the voltage between said positive electrode and said measurement electrode to detect overcharging of said sealed storage battery.

36. A sealed storage battery system according to claim 35, wherein said charging device includes a means for stopping charging in response to the detection of overcharging by said measurement means.

37. A method for detecting overcharging of a sealed storage battery according to claim 28, wherein said resistance means includes a silicon diode and a fixed resistance.

38. A method for detecting overcharging of a sealed storage battery according to claim 29, wherein said resistance means includes a silicon diode and a fixed resistance.

* * * * *

UNITED STATES PATENT AND TRADEMARK OFFICE
CERTIFICATE OF CORRECTION

PATENT NO. : 4,143,212

DATED : March 6, 1979

INVENTOR(S) : MITSUSHI UENO ET AL.

It is certified that error appears in the above-identified patent and that said Letters Patent are hereby corrected as shown below:

Claim 1, column 11, line 31: delete "and" and insert therefor --an--.

Claim 27, Column 13, line 12: delete "holes" and insert therefor --holds--.

Signed and Sealed this

Twenty-fourth Day of July 1979

[SEAL]

Attest:

LUTRELLE F. PARKER

*Attesting Officer*     *Acting Commissioner of Patents and Trademarks*